(12) United States Patent
Andrieu et al.

(10) Patent No.: US 8,809,964 B2
(45) Date of Patent: Aug. 19, 2014

(54) METHOD OF ADJUSTING THE THRESHOLD VOLTAGE OF A TRANSISTOR BY A BURIED TRAPPING LAYER

(75) Inventors: François Andrieu, Grenoble (FR); Emmanuel Augendre, Montbonnot (FR); Laurent Clavelier, Grenoble (FR); Marek Kostrzewa, Grenoble (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 308 days.

(21) Appl. No.: 12/865,549

(22) PCT Filed: Feb. 11, 2009

(86) PCT No.: PCT/FR2009/050212
§ 371 (c)(1),
(2), (4) Date: Jul. 30, 2010

(87) PCT Pub. No.: WO2009/103921
PCT Pub. Date: Aug. 27, 2009

(65) Prior Publication Data
US 2011/0001184 A1 Jan. 6, 2011

(30) Foreign Application Priority Data
Feb. 19, 2008 (FR) ...................... 08 51073

(51) Int. Cl.
*H01L 21/336* (2006.01)
*H01L 29/792* (2006.01)

(52) U.S. Cl.
USPC .............. 257/392; 257/324; 257/E21.409; 257/E29.309; 257/391; 438/287

(58) Field of Classification Search
CPC ............... H01L 21/84; H01L 27/1203; H01L 29/42348; H01L 29/792

USPC .......... 257/324, E21.409, E29.309, 392, 391; 438/287

See application file for complete search history.

(56) References Cited

U.S. PATENT DOCUMENTS 7,057,234 B2 * 6/2006 Tiwari ............................ 257/324
7,098,505 B1 * 8/2006 Han et al. ...................... 257/324
(Continued)

FOREIGN PATENT DOCUMENTS

EP 0 409 697 A1 1/1991

OTHER PUBLICATIONS

International Search Report Dated Jul. 31, 2009 (3 pgs).

(Continued)

*Primary Examiner* — Tom Thomas
*Assistant Examiner* — Benjamin Tzu-Hung Liu
(74) *Attorney, Agent, or Firm* — Brinks Gilson & Lione

(57) ABSTRACT

An electronic subassembly and associated method for the production of an electronic subassembly include a semiconductor layer bearing at least a first transistor having an adjustable threshold voltage is joined to an insulator layer and in which a first trapping zone is formed at a predetermined first depth. The first trapping zone extends at least beneath a channel of the first transistor and includes traps of greater density than the density of traps outside the first trapping zone, in such a way that the semiconductor layer and the first trapping zone are capacitively coupled. The useful information from the first transistor includes the charge transport within this transistor. A second trapping zone can be formed that extends at least beneath a channel of a second transistor that is formed by a second implantation with an energy and/or a dose and/or atoms that differ from those used to form the first trapping zone.

20 Claims, 9 Drawing Sheets

(56) References Cited

U.S. PATENT DOCUMENTS

| | | | |
|---|---|---|---|
| 7,119,395 B2* | 10/2006 | Gutsche et al. | 257/321 |
| 7,692,963 B2* | 4/2010 | Shino et al. | 365/185.05 |
| 7,829,938 B2* | 11/2010 | Bhattacharyya | 257/325 |
| 2005/0067659 A1 | 3/2005 | Gutsche et al. | |
| 2007/0018342 A1* | 1/2007 | Sandhu et al. | 257/E29.071 |
| 2007/0105310 A1 | 5/2007 | Chen et al. | |
| 2007/0267679 A1* | 11/2007 | Cha et al. | 257/315 |

OTHER PUBLICATIONS

Kumar et al., "*Scaling of Flash NVRAM to 10's of nm by Decoupling of Storage From Read/Sense Using Back-Floating Gates*"—IEEE Transactions on Nanotechnology, vol. 1, No. 4, Dec. 2002—pp. 247-254.

Silva et al., "*A Nanoscale Memory and Transistor Using Backside Trapping*"—IEEE Transactions on Nanotechnology, vol. 3, No. 2, Jun. 2004—pp. 264-269.

Pretet, et al., "*Silicon-on-Nothing MOSFETs: Performance, Short-Channel Effects, and Backgate Coupling*"—IEEE Transactions on Electron Devices, vol. 51, No. 2, Feb. 2004—pp. 240-245.

Lim, et al., "*Threshold Voltage of Thin-Film Silicon-on-Insulator (SOI) Mosfet's*"—IEEE Transactions on Electron Devices, vol. ED-30, No. 10, Oct. 1983—pp. 1244-1251.

\* cited by examiner

METHOD OF ADJUSTING THE THRESHOLD VOLTAGE OF A TRANSISTOR BY A BURIED TRAPPING LAYER

PRIORITY CLAIM

This application is a nationalization under 35 U.S.C. 371 of PCT Application No. PCT/FR2009/050212, filed Feb. 11, 2009, which claims priority to French Patent Application No. 0851073, filed Feb. 19, 2008, and incorporated by reference herein.

TECHNICAL FIELD

The present invention concerns an electronic subsystem and a method for producing it. It applies in particular to adjusting the threshold voltage of an MOS (metal-oxide semiconductor) transistor by means of a buried trapping layer.

BACKGROUND

The threshold voltage is a key parameter of an MOS transistor. In an electronic circuit, transistors with different threshold voltages are generally required because transistors do not all have the same functions and must offer different performance. For example, some transistors in a circuit have a high threshold voltage and thus a low "blocked" state current (low-consumption transistors) whereas others have a low threshold voltage and thus a high "passing" state current (high-performance transistors). Different families of transistors are therefore used in circuit design. These transistors are produced on bulk silicon (Si), silicon on insulator (SOI) or silicon on nothing (SON), as described in the paper "Silicon-on-Nothing MOSFETs: Performance, Short-Channel Effects, and Backgate Coupling" by Jérémy Pretet et al, IEEE Transactions on Electron Devices, Vol. 51, No. 2, February 2004.

The threshold voltage generally depending on the doping of the channel of the transistor, differently implanted transistor channels are generally used. Another technique, known as the fully depleted (FD) technique, is used to produce transistors on undoped films. This technique may be used on SOI, as described in the paper "Threshold Voltage of Thin-Film Silicon-on-Insulator (SOI) MOSFETs" by Kyung-Kyu LIM et al., IEEE Transactions on Electron Devices, Vol. ED-30, No. 10, October 1983. This technique is referred to as the FDSOI (fully-depleted SOD or SON technique. It provides better electrostatic control, reduced variability and increased mobility. In this case, the threshold voltage is essentially dependent on the output work of the gate of the transistor (and little dependent on the doping).

Accordingly, to obtain different threshold voltages in this architecture, one solution is to co-integrate gates with different output works. This approach has numerous drawbacks. Adjusting the output work of the gates and the co-integration remains a real technological and physical challenge. Adjusting the threshold voltages in FD devices generally also remains a major challenge blocking their further development.

An MOS transistor with adjustable threshold voltage is known from the document European Patent Publication No. EP 0 409 697. In that document, a floating gate transistor has a threshold voltage that is adjusted continuously by trapping. Compared to the usual floating gate structure, the tunnel oxide in the above document is thinned above the drain to facilitate programming. However, in this case, the gate stack must at one and the same time be compatible with memory applications and logic applications, which is difficult to achieve. In logic applications, there is a benefit in increasing the gate/channel coupling (by reducing the thickness of the gate oxide), whereas in memory applications, a minimum tunnel oxide size must be maintained to guarantee good retention. The oxide is therefore necessarily thick, which is not the optimum for logic transistors.

There is also known the document by H. Silva and S. Tiwari "A Nanoscale Memory and Transistor Using Backside Trapping", IEEE Trans. on Nanotechnology Vol. 3 No. 12 June 2004. In that document, the threshold voltage of the transistor is modulated by trapping in the buried insulation and by capacitive coupling. The threshold voltage is always modulated under the same (binary) conditions. The curves in the above document are typical of the memory application, in terms of endurance and retention time.

The corresponding U.S. Pat. No. 7,057,234 concerns the structure: silicon nanocrystals are referred to as possible trapping sites. The above document indicates the use of this structure either for transistors in logic mode or for memory points, which modes are distinguished by different bias sets. The above document proposes to use the trapping mechanism for memory points only.

Thus the above document does not relate in any way to producing transistors with an adjustable threshold voltage, and notably transistors in which the threshold voltage is intentionally adjusted as a function of the logic or analog target application of the transistor (low threshold voltage transistor, standard threshold voltage transistor or high threshold voltage transistor).

Thus there is at present no technological solution that makes it possible to produce FD transistors that are optimized, notably from an electrostatic point of view (and more particularly for short channels) and simultaneously have a threshold voltage that is adjustable as a function of the intended logic or analog application of the transistor.

SUMMARY

The present invention aims to remedy these drawbacks.

To this end, a first aspect of the present invention provides an electronic subsystem, characterized in that it includes:

a semiconductor layer carrying at least one first transistor with an adjustable threshold voltage, and an insulation layer including, at a predetermined first depth, a first trapping area extending at least under the channel of said first transistor and including traps with a density greater than the density of traps outside said first trapping area, the semiconductor layer and the first trapping area being capacitively coupled and the useful information of said first transistor being the transport of charges in that transistor.

Because of the coupling of the traps with the gate, the present invention provides for a standard transistor application in which it is the transport of charges (in particular, the current) that constitutes the information, the voltage being one parameter among others of the current/voltage characteristic of the device, on the same terms as the mobility of the charge carriers, for example. Likewise, in this application, the state of charge of the structure is not the principal information. Thus in the "transistor" target application of the present invention, the information varies according to the function of the transistor. In analog or radio-frequency (RF) applications, the whole of a portion of the current/voltage characteristic of the transistor is used and constitutes the information. Elementary devices are not necessarily in matrix form but divided into blocks providing a particular function.

Of the advantages of the present invention, the following may also be cited:

- the threshold voltage may be adjusted by bias of the area of the substrate under the transistor concerned (this is known as "Fowler Nordheim" writing),
- the threshold voltage may be adjusted transistor by transistor by combining a substrate bias and a drain bias (this is known as hot carrier writing). In this case, the substrate terminal may be shared/pooled for a plurality of transistors without this assigning them a particular function relative to the value of the threshold voltage; this adjustment necessitates at least one terminal for controlling the voltage Vds at the terminals of the transistor for which the threshold voltage is to be adjusted or indirect control of the voltage Vds of the transistor via accessible terminals of the circuit in which the transistor is incorporated,
- the threshold voltage may be adjusted by writing more or fewer buried traps quasi-continuously whereas, if using a plurality of gate output works or a plurality of channel dopings, only a discrete number of threshold voltage states is allowed, and
- the threshold voltage of a transistor may be reconfigured by bias (of the drain and substrate) after fabrication of the transistors. In the prior art, transistor threshold voltages are generally fixed (by the channel doping and the output work of the gate) during fabrication of the transistors, are not reconfigurable afterwards and may evolve in an uncontrolled manner, notably as a function of temperature or irradiation.

The last two advantages cited above make it possible to envisage the following applications:

- dynamic allocation of consumption/speed parameters of blocks of circuitry,
- compensation of threshold voltage variability caused by technological fluctuations,
- compensation of threshold voltage drift caused by a change of external temperature (and control of consumption),
- compensation of threshold voltage drift caused by use in an irradiated environment (and increase in system service life),
- reconfigurable circuits, and
- production of MOS transistors with a variable threshold voltage.

Note that the useful information of each transistor is preferably the transport of charges within the transistor and not the state of charge of the transistor, as in the prior art. Thus the threshold voltage is adapted to optimize the operation of the transistor as a function of the logic or analog application of the transistor.

According to particular features, the first trapping area extends only under the channel of said first transistor.

According to particular features, the electronic subsystem of the present invention, as succinctly defined hereinabove, further includes a conductive area placed, relative to the insulation layer, on the other side of the semiconductor layer carrying at least one first transistor.

This conductive area makes it possible to control the threshold voltage of each transistor it faces, this threshold voltage being modulated by the presence of the traps in an intermediate position between the transistor and the conductive area.

According to particular features, the conductive area is an electrically conductive substrate.

According to particular features, said conductive area is an area of a substrate under the insulation layer and including dopants, for example implanted dopants.

According to particular features, the electronic subsystem of the present invention, as succinctly defined hereinabove, includes at least one second trapping area.

According to particular features, the second trapping area is at a second depth different from the first depth.

According to particular features, the second trapping area has a trap density distribution different from that of the first trapping area.

According to particular features, said second trapping area is at least partly under a channel of a second transistor.

According to particular features, said traps consist of nanocrystals.

According to particular features, said nanocrystals include atoms of Si, Ge, metal or semiconductor/metal alloy in an insulation layer.

According to particular features, said traps are formed by implanting atoms of N or F and heat treatment.

According to particular features, the insulation layer is formed of a stack of two oxide layers, a continuous trapping layer being formed at the interface of the two oxide layers.

According to particular features, the insulation layer is formed of a stack comprising an oxide layer, a continuous nitride or polysilicon trapping layer and an oxide layer.

In this case, the upper oxide layer is used to inject charges by the tunnel effect into the trapping layer, the trapping layer is used to store charges in traps and the lower oxide layer is used to provide coupling between the trapping layer and a substrate or the conductive layer.

A second aspect of the present invention provides a method of producing an electronic subsystem, characterized in that it includes:

- a step of assembling a semiconductor layer carrying at least one first transistor with an adjustable threshold voltage and an insulation layer, and
- a step of forming in the insulation layer, at a predetermined first depth, a first trapping area extending at least under a channel of said first transistor and including traps with a density greater than the density of traps outside said first trapping area so that the semiconductor layer and the first trapping area are capacitively coupled, the useful information of said first transistor being the transport of charges in that transistor.

According to particular features, during the step of forming the first trapping area, a first implantation of atoms of Ge, Si, metal or semiconductor/metal alloy in the insulation layer is effected.

According to particular features, during the step of forming the first trapping area, annealing to form nanocrystals is effected.

According to particular features, the method of the present invention, as succinctly defined hereinabove, includes a step of forming a second trapping area extending at least under a channel of a second transistor by a second implantation with an energy and/or a dose and/or atoms different from those used in the first implantation.

According to particular features, during the step of forming the first trapping area, masking to position the first trapping area is effected.

According to particular features, during the step of forming the first trapping area, direct gate alignment through the gate stack is effected, the transistor gate being used as a mask to align traps with the channel of the transistor.

According to particular features, during the step of forming the first trapping area, a gate last alignment of the transistors is effected by emptying a gate last cavity of at least one transistor, effecting implantations in the cavities and then filling each cavity with a new gate stack.

According to particular features, the method of the present invention, as succinctly defined hereinabove, includes a step of FN writing a transistor of the electronic subsystem.

According to particular features, the method of the present invention, as succinctly defined hereinabove, includes a step of hot carrier writing a transistor of the electronic subsystem.

Note that it is beneficial to use a buried oxide (or a buried oxide stack) that is thin or has a high dielectric constant to reduce the bias of the substrate to be applied to charge the traps of the oxide or oxide stack. Stacks allowing deletion/writing at around 10 volts have been produced by the inventors for buried stacks of 5 nm tunnel oxide/70 nm nitride/70 nm oxide.

According to particular features, the method of the present invention, as succinctly defined hereinabove, includes a step of bonding stacks of layers to associate the semiconductor layer, the insulation layer and a conductive layer.

The particular advantages, objects and features of this method being similar to those of the electronic subsystem of the present invention, as succinctly defined hereinabove, they are not repeated here.

BRIEF DESCRIPTION OF DRAWING

Other advantages, objects and features of the present invention emerge from the following description given by way of nonlimiting explanation with reference to the appended drawings, in which.

DETAILED DESCRIPTION

Figure 1:
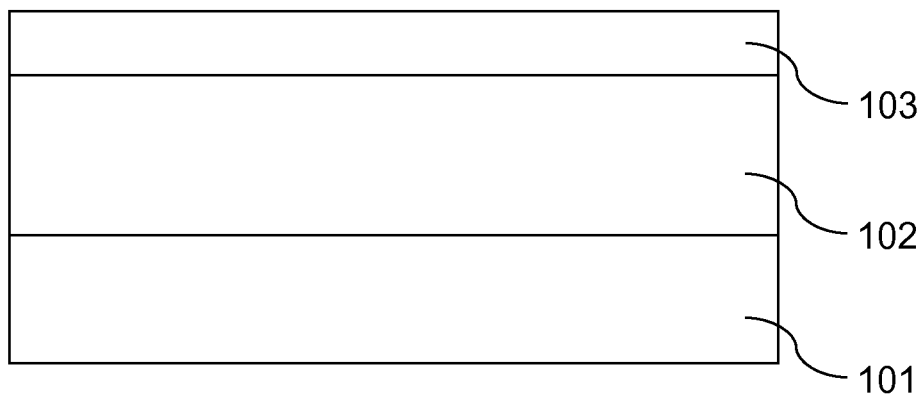
FIGS. 1 to 5 represent different steps in the production of the electronic subsystem of a first particular embodiment of the present invention.

As seen in FIG. 1, to fabricate the electronic subsystem of the first embodiment of the present invention, the starting point is an assembly of layers including:
   a substrate 101,
   a buried insulation layer 102, referred to as a "trapping layer", capable of trapping charges through the effect of an electric field, and
   an upper semiconductor 103, etched or not.

The trapping layer 102 and the upper semiconductor layer 103 are capacitively coupled to enable production in the semiconductor layer of an FD (Fully Depleted) transistor.

Figure 2:
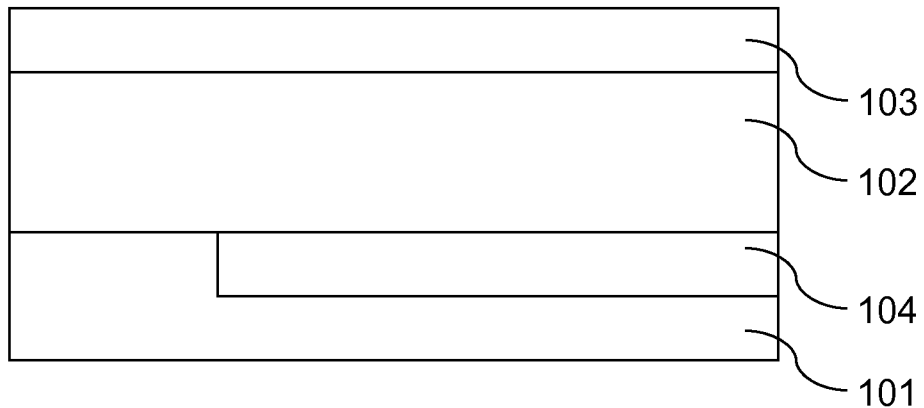

Then, as shown in FIG. 2, a continuous or non-continuous conductive layer 104 is produced under the buried insulation 102, for example by implanting dopant in the substrate 101 using masks. It is seen that this conductive layer 104 can be formed in an analogous manner to a box terminal or substrate terminal in the case of PDSOI (partially depleted SOI) transistors. This conductive layer 104 may be omitted if the substrate 101 is itself sufficiently conductive to provide that function, as explained hereinafter.

Figure 3:
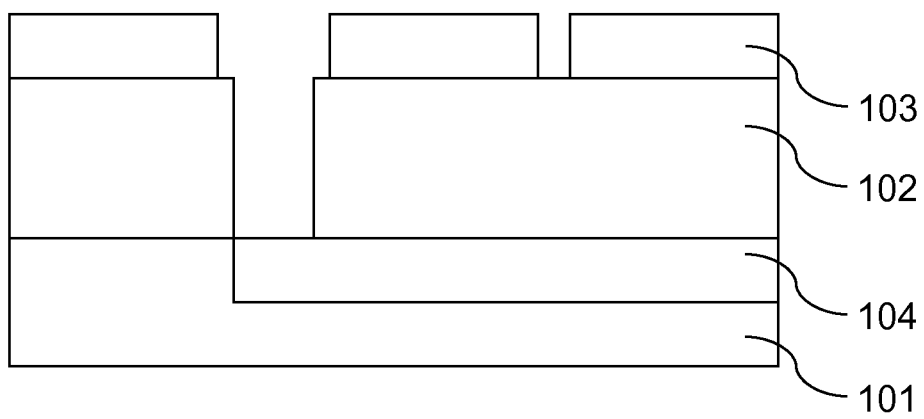

Then, as shown in FIG. 3, the active area of the upper semiconductor 103 is etched.

Figure 4:
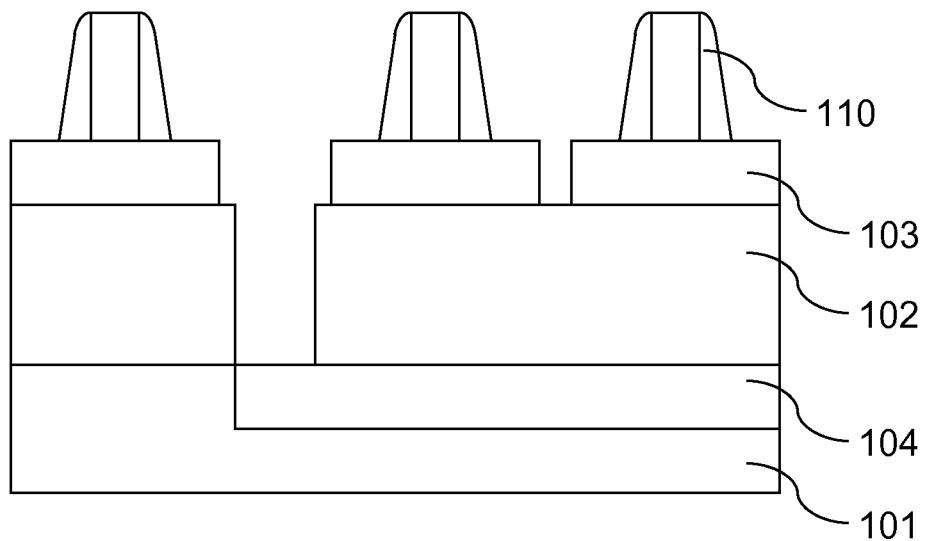

As shown in FIG. 4, MOS transistors 110 are then produced on the surface of the semiconductor layer 103 in a manner that is known in itself. During the process of fabricating the MOS transistors, a step of etching the buried insulation 102 using masks is carried out. This step is advantageously carried out before any silicidation of the source/drain and the gate of the transistors.

Figure 5:
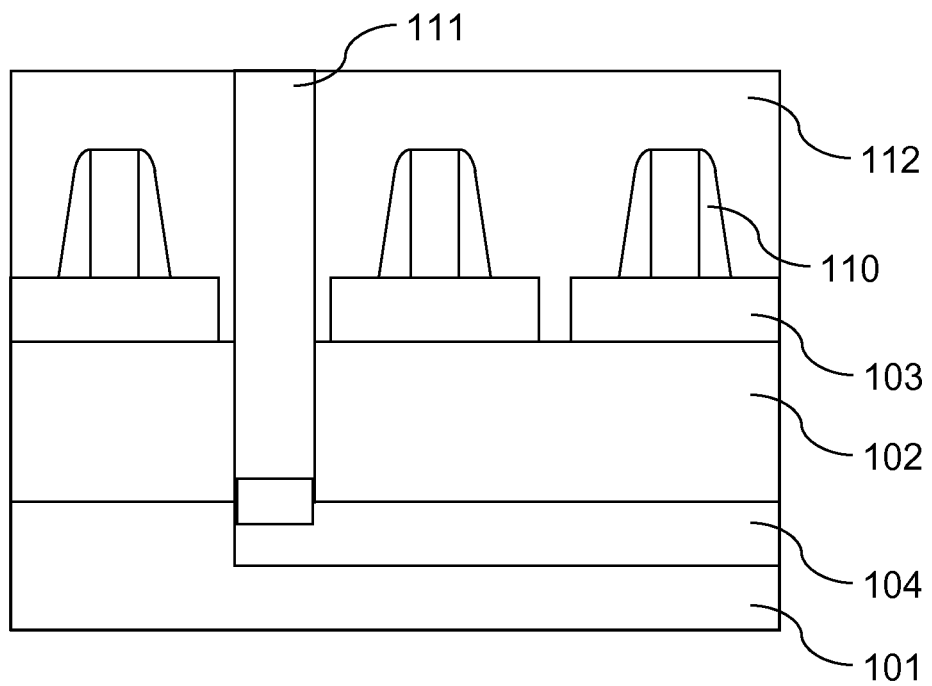

Finally, as shown in FIG. 5, an insulator 112 is deposited on the transistors 110, after which contacts (not shown) are formed on the gate and on the active areas, including at least one contact 111 on the conductive area 104.

Figure 6:
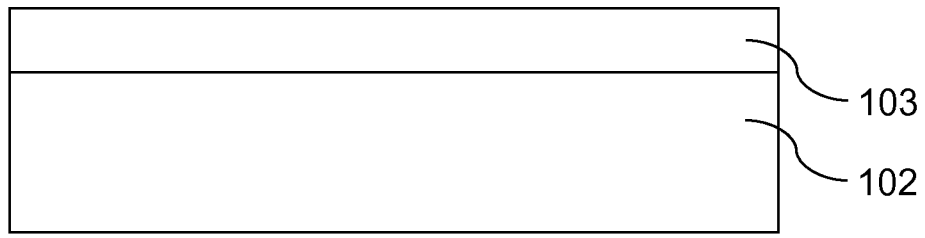
FIG. 6 represents diagrammatically an alternative step in the production of the electronic subsystem shown in FIG. 5, FIGS. 7 to 9 represent diagrammatically steps of the production of the electronic subsystem of a second particular embodiment of the present invention.
Figure 6:
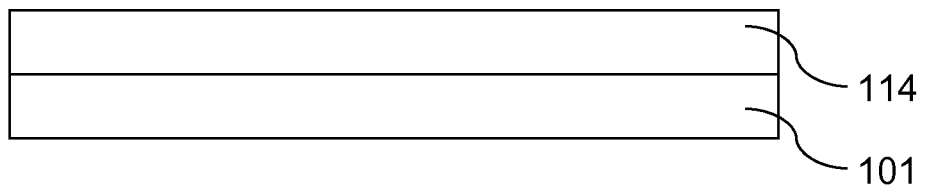

The step shown in FIG. 2 that relates to the production of a conductive layer 104 may, in the case of a continuous conductive layer 114, be replaced by a step of bonding two stacks as seen in FIG. 6. The first stack includes the substrate 101 associated with the conductive layer 114, for example formed of metal or a doped semiconductor. The second stack includes at least the insulation or trapping layer 102 and the semiconductor layer 103. Alternatively, the bonding relates to, on the one hand, the substrate 101 and, on the other hand, the semiconductor layer 103, the trapping insulation layer 102 and the conductive layer 114. Alternatively, if the trapping insulation layer 102 is itself formed by a stack of a plurality of layers 121, 122 and 123 (see FIGS. 16 and 17), for example as in the case of a nitride or polysilicon trapping layer disposed between two oxide layers, the bonding may be effected between two of those layers. In all cases, it is also possible to provide between the substrate 101 and the conductive layer 114 an insulation, for example $SiO_2$, layer, with bonding taking place at the level of this layer or not.

Alternatively, the insulation layer is formed of a stack of two oxide layers, a continuous trapping layer being formed at the interface of the two oxide layers. Accordingly, to form the first trapping area, it is possible to molecularly bond two insulation layers, the trapping area appearing at the bonding interface.

Figure 16:
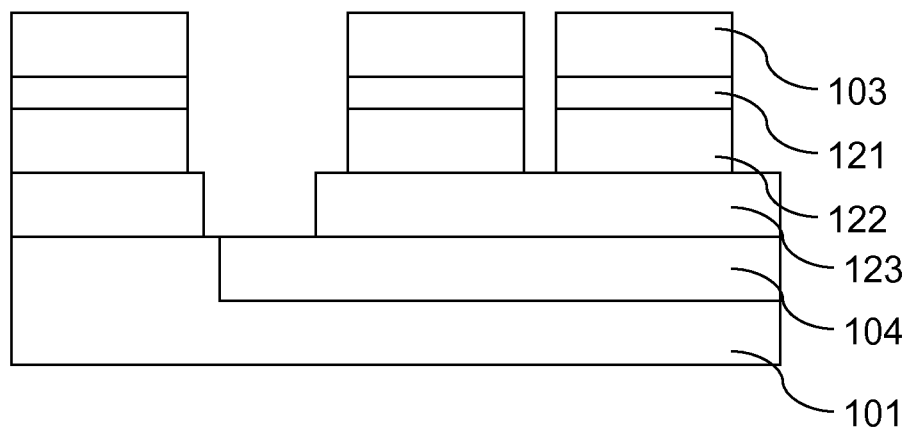
FIGS. 16 and 17 represent diagrammatically steps of the production of the electronic subsystem of a fifth particular embodiment of the present invention.
Figure 17:
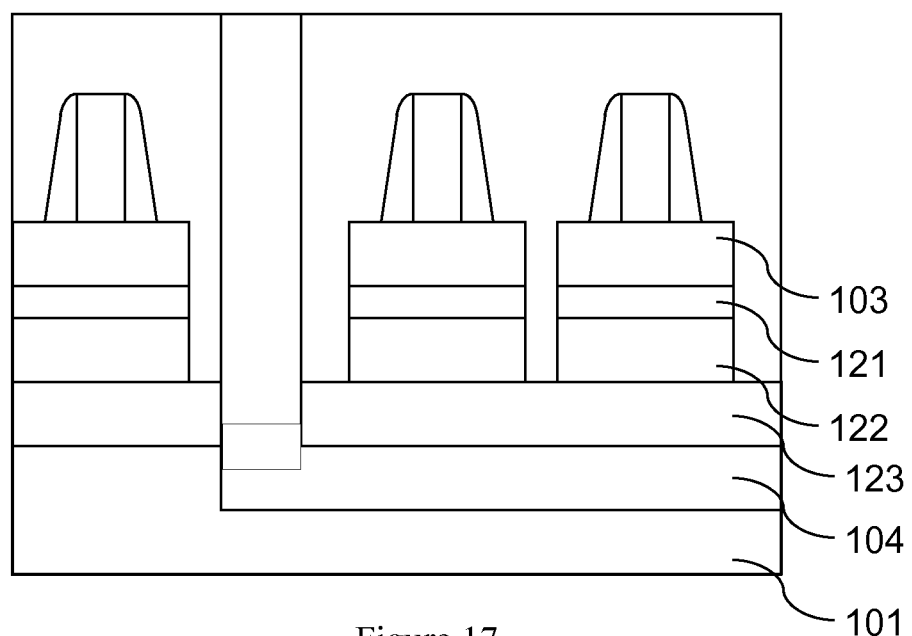

Whether the step of producing a conductive layer is effected as shown in FIG. 2 or as shown in FIG. 6, the trapping insulation layer 102 may be a stack of a type known in the memory application art. For example, as shown in FIGS. 16 and 17, the trapping insulation layer 102 may be a stack comprising an oxide layer 121, a trapping layer 122 and an oxide layer 123. In this case, the upper oxide layer 121 is called the tunnel oxide layer. The upper oxide layer 121 is used to inject charges into the trapping layer 122 by the tunnel effect. The thickness of the tunnel oxide layer 121 is of the order of a few nanometers, typically 10 nm. The tunnel oxide layer 121 is typically formed in $SiO_2$ and/or in a high-K material such as $HfO_2$ or $Al_2O_3$. Using a high-K material makes it possible to reduce the thickness of the tunnel oxide layer 121 and the programming voltages without excessively penalizing retention.

The trapping layer 122 stores charges in traps. Its thickness is of the order of a few nanometers to a few tens of nanometers. It may be in polysilicon, nitride, $Al_2O_3$, sub-stoichiometric $SiO_2$ with nanocrystals of Si, Ge, metal or semiconductor/metal alloy, produced by deposition and annealing or by implantation as disclosed in the document US Publication No. 2007 0105310. The last three options, using nitride, $Al_2O_3$ or $SiO_2$ with localized trapping, make it possible to reduce the thickness of the tunnel oxide layer 121 relative to polysilicon.

Alternatively, forming the trapping sites includes implanting atoms of N (nitrogen) or F (fluorine), which do not create nanocrystals but also make it possible to create or heal traps.

Accordingly, discrete trapping sites are generally formed, for example after implantation of atoms of N or F and heat treatment and/or forming nanocrystals as explained above.

The oxide layer 123 is referred to as the "control oxide" or "interpoly" layer. The oxide layer 123 provides coupling between the trapping layer and the control "gate" that consists of the substrate 101 or the conductive layer 104 when present. Note that it is possible for there to be no conductive layer 104 if the substrate 101 is sufficiently conductive. In this case, the transistors cannot be controlled individually, unless control via the drain (known as "hot carrier" control) is used. The control oxide layer 123 may consist of $SiO_2$, $Si_3N_4$ or $Al_2O_3$, the latter material being better in terms of the equivalent oxide thickness (EOT) vs. leakage trade-off, or an $SiO_2/Al_2O_3$ or high-K/$SiO_2$ stack, which has the advantage of a better EOT vs. leakage trade-off.

The insulation layer 102 may be continuous or non-continuous. It may be partly discontinuous if it consists of a stack, as in the fifth embodiment described with reference to FIGS. 16 and 17.

Figure 7:
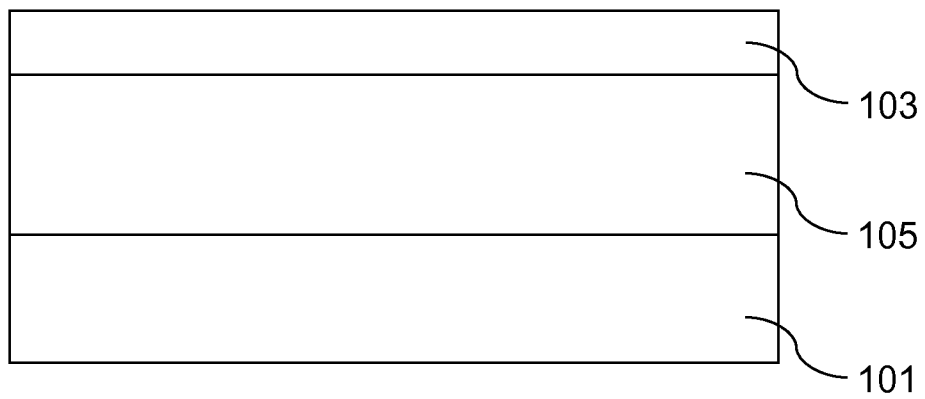

To produce the electronic subsystem of the second particular embodiment of the present invention shown in FIG. 7, the starting point is an SOI or SON structure including:
   the substrate 101,
   a buried insulation layer 105, preferably in $SiO_2$,
   the upper semiconductor 103, etched or not.

Figure 8:
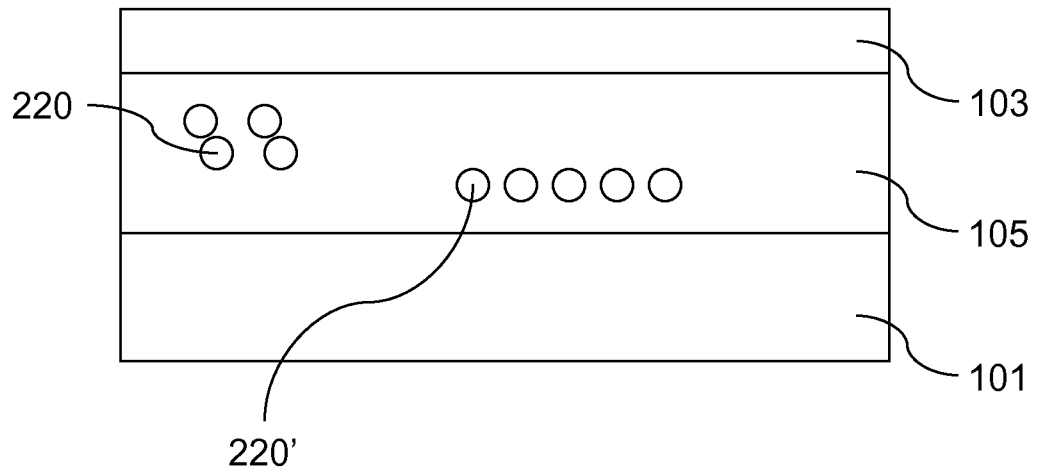

Then, as shown in FIG. 8, atoms of Si, Ge, metal or a metal/semiconductor alloy are implanted in the insulation layer 105 followed by annealing to form nanocrystals (also known as "traps" or "trap centers") 220. In this case the insulation layer 105 has the same function as the layers 121 and 123 described above and the trapping centers 220 assume the role of the layer 122. Thus the layers 121 and 123 may be defined by the regions without implantation of the insulation layer 105 and the layer 122 may be defined by the region with implanted trapping centers 220. It is seen that the implantation depth is controlled by the implantation energy. The trapping center density is controlled by the implantation dose. The distribution of the trapping centers is produced by masking.

Figure 9:
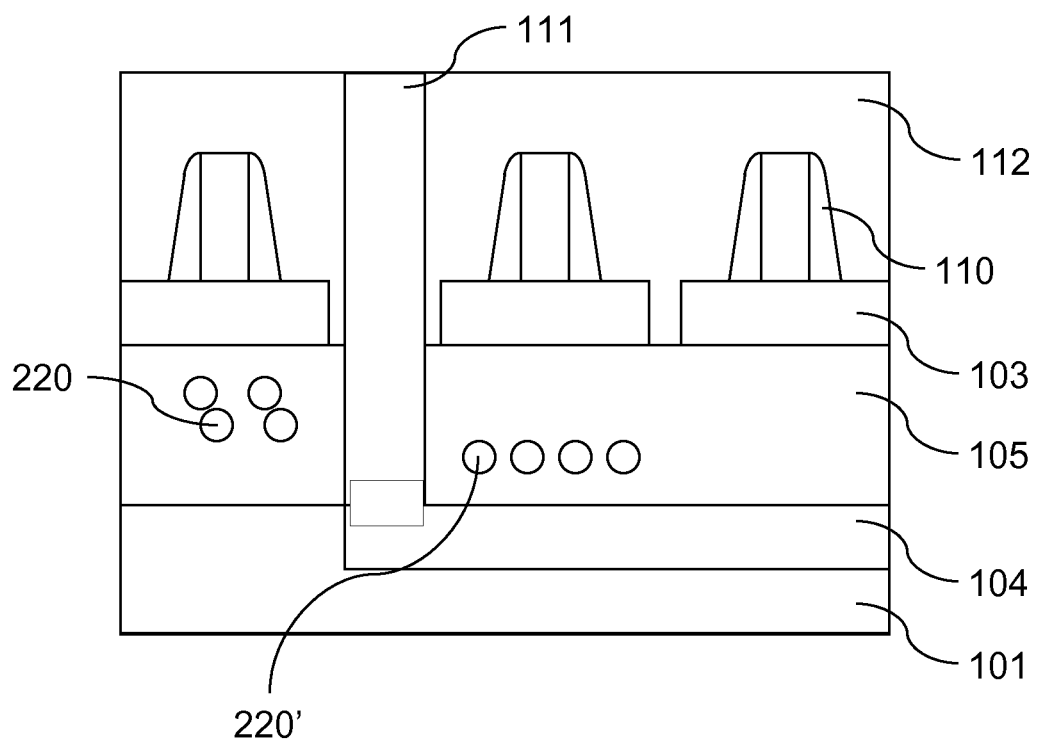

As shown in FIG. 9, MOS transistors 110 are then produced on the surface of the semiconductor layer 103, in a manner known in itself, an insulator 112 is deposited on the transistors 110, and contacts are formed on the gate and/or the active areas (not shown), a contact 111 being produced on the conductive area 104.

The second embodiment is advantageous in that:
   it necessitates no substrate other than a standard SOI or SON substrate,
   it makes it possible to create a plurality of trapping regions in the insulation layer 105, with positions (at a depth controlled by the implantation energy) or trap densities (controlled by the implanted dose) that are different and by effecting successively or simultaneously a plurality of implantations with different depths and/or doses and/or elements. This in particular makes it possible to modify the possible threshold voltages for the same writing condition. It is thus possible to define more or less sensitive writing regions. For example, regions may be provided in which the threshold voltage can vary very greatly (thanks to a high density of traps 220 or to traps 220 closer to the surface) and others where the modulation of the threshold voltage is weaker for given bias conditions (lower density of traps 220' or traps 220' implanted more deeply), and
   it makes possible a local approach: masking may be used to localize the trapping areas 220 in the insulation layer 105. In particular, the trapping areas 220 may be placed under the transistors 110 for which the threshold voltage must be changed. To be more precise, it is possible to localize this implantation under the channel only (and not also under the source and drain), which makes it possible to reduce trap discharge currents and stray capacitances.

Figure 10:
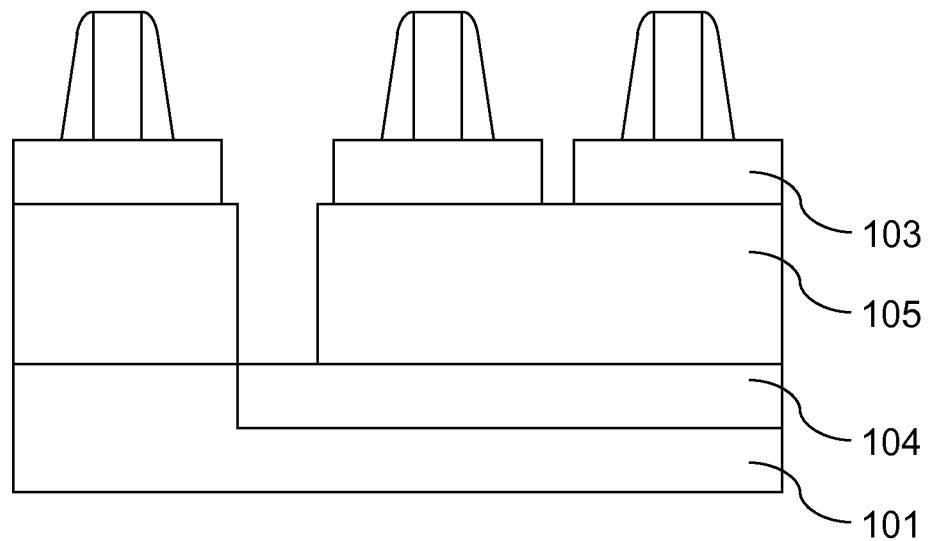
FIGS. 10 to 12 represent diagrammatically steps of the production of the electronic subsystem of a third particular embodiment of the present invention.
Figure 11:
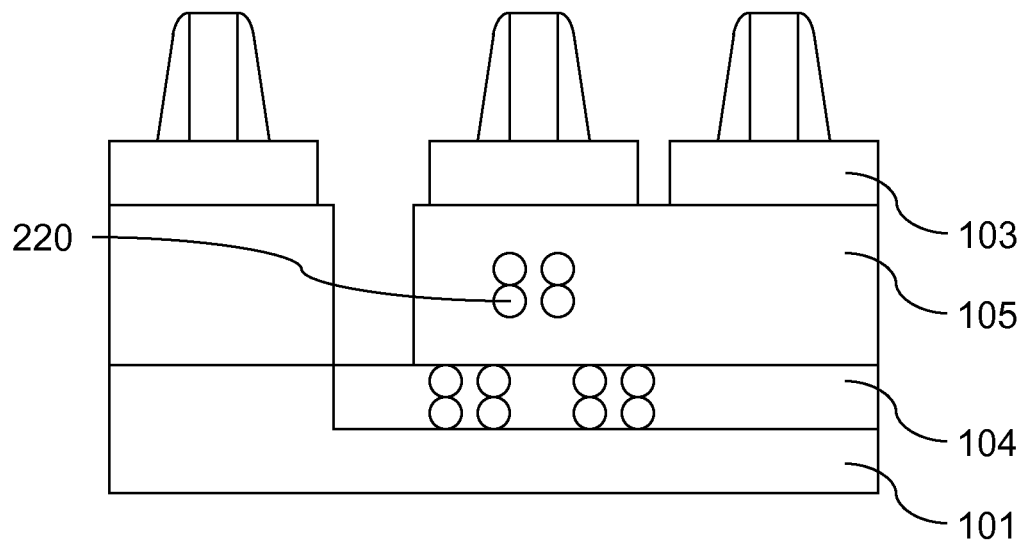
Figure 12:
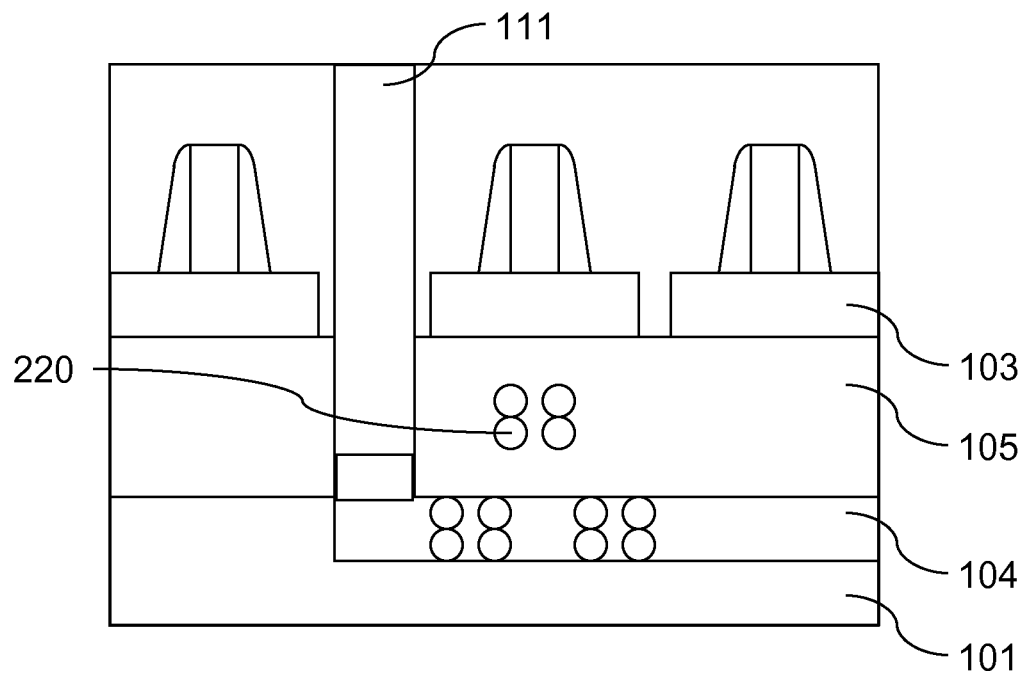

In the third embodiment, which is described with reference to FIGS. 10 to 12 and constitutes a variant of the second embodiment, implantation is effected through the gate stack (this is known as "direct gate implantation"). As shown in FIG. 11, the trapping centers 220 are implanted using the gate of the transistor 110 as a mask to obtain self-alignment of the trapping centers 220 on the channel of the transistor 110. Implantation is effected throughout the structure. Given the additional thickness of the stack at the gate, implantation at the gate is less deep than in the rest of the structure. The species implanted outside the channel are therefore implanted deeper. As shown in FIGS. 11 and 12, they may even be returned to the conductive area 104. FIG. 12 shows the final structure.

Figure 13:
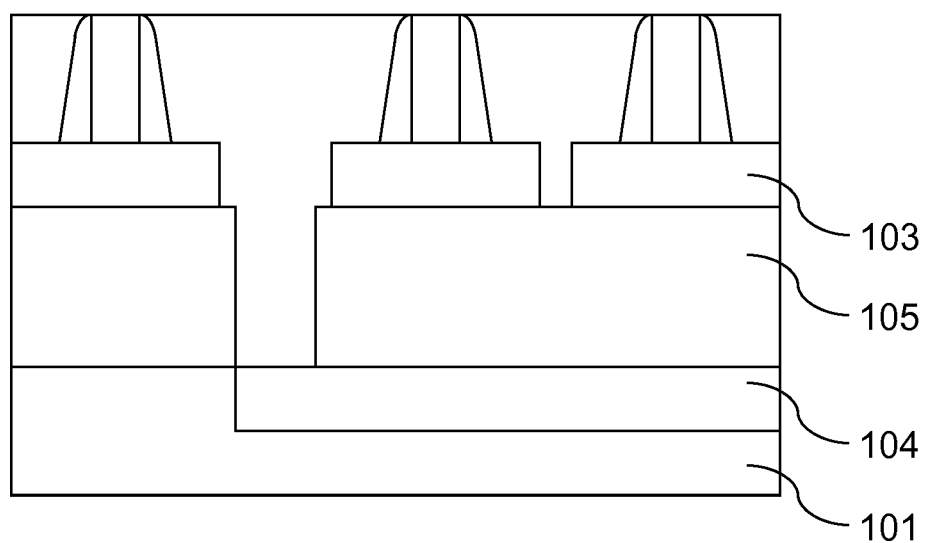
FIGS. 13 to 15 represent diagrammatically steps of the production of the electronic subsystem of a fourth particular embodiment of the present invention.
Figure 14:
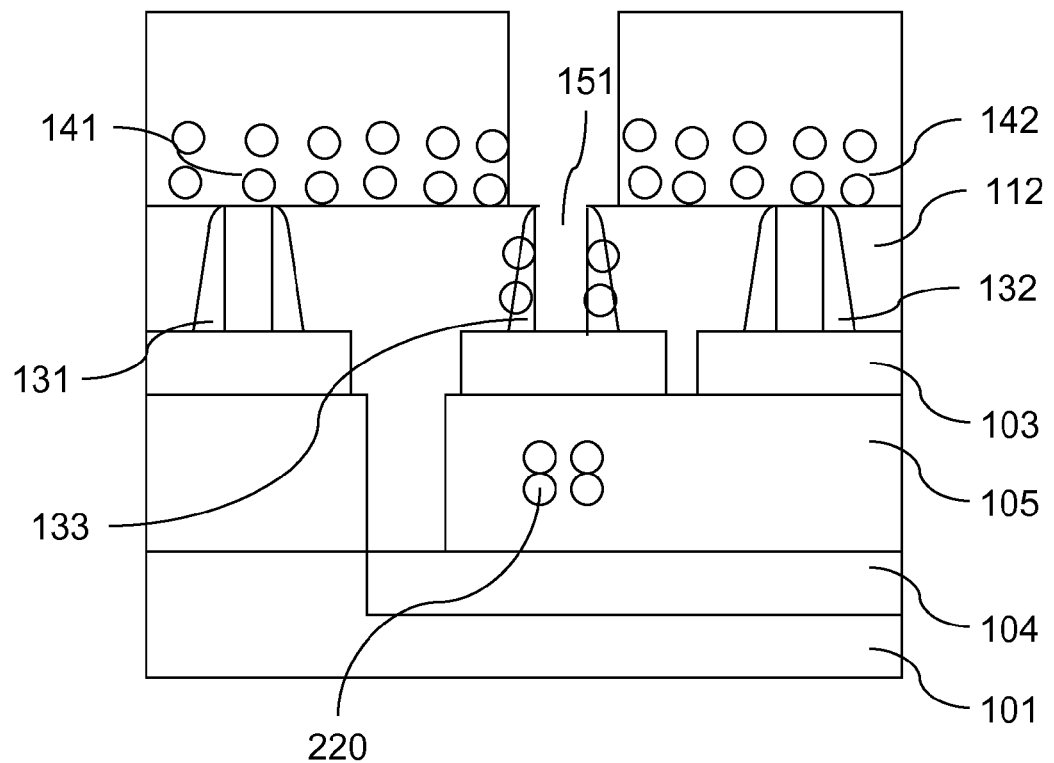

In the fourth embodiment, which is described with reference to FIGS. 13 to 15 and also constitutes a variant of the second embodiment, gate last integration of the transistors 110 is effected and implantation is effected in the cavities or through the gate in a direct gate (gate first) integration.

FIG. 13 shows again the structure described with reference to FIGS. 4 and 5. As shown in FIG. 14, for some transistors (here the transistors 132 and 133 on the right-hand side of FIG. 14) the gate last cavity 151 is then emptied in the future gate areas, using a mask. The mask 141 makes it possible to avoid this operation at the level of the transistor 131, for example. It also masks subsequent implantations. It is advantageously aligned to the gates of the transistors 151 under the channel of which the implanted atoms are to be positioned.

Implantation follows, to form nanocrystals 220. The structure being finer at the openings 151, implantation in this area is deeper than in the rest of the structure. As shown for the transistor 132, it is advantageously possible to provide for implantation through a mask 142 to limit implantation solely to the level of the channel of the transistor 132.

Figure 15:
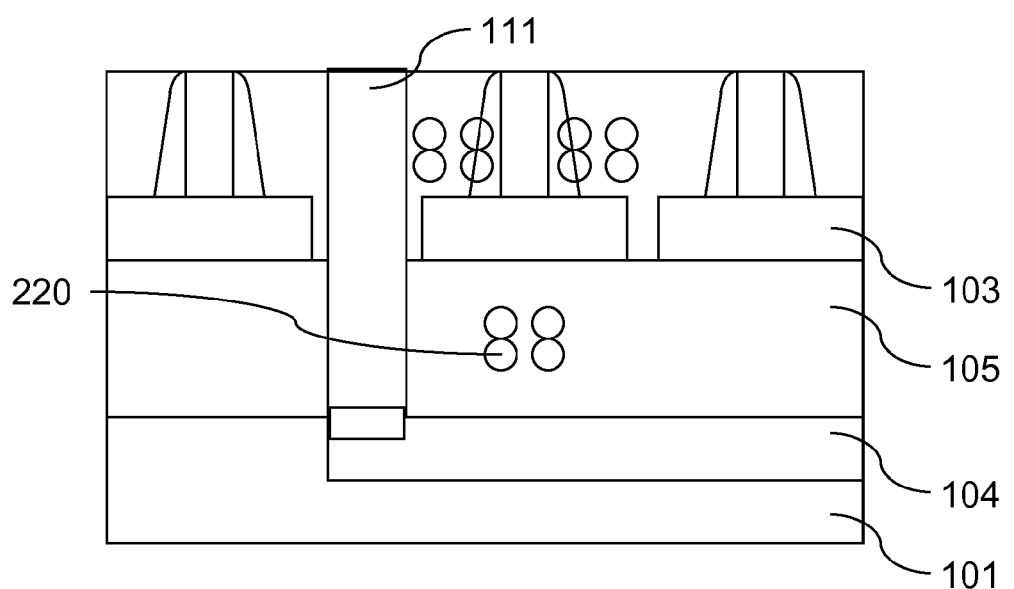

As shown in FIG. 15, the cavities are afterwards filled with a stack of gates based on polysilicon, for example. The contact terminals are then produced to form the final structure represented in FIG. 15 (not all the contacts are shown, in particular the source, drain, gate contacts).

The third and fourth embodiments are advantageous through not creating stray currents or capacitances. It is principally the region under the channel that is charged, because of the shielding by the source/drain, and that controls the threshold voltage, for the same reason. The trap regions placed under the sources and the drains may induce stray capacitance between the source/drain and the trapping areas and stray currents that may lead to discharging of the traps, in particular for a continuous polysilicon layer and, to a lesser degree, a discontinuous trapping area.

The third and fourth embodiments are also advantageous as they make it possible, as in the second embodiment, to adjust different transistors (or groups of transistors) with the same write or delete bias by locally implanting with different species and/or doses and/or energies, depending on the transistors (or groups of transistors), making it possible to obtain traps that are more or less deep and traps that are more or less dense, depending on the transistors (or groups of transistors).

In the electronic subsystem of the fifth particular embodiment of the present invention described with reference to FIGS. 16 and 17, a stack of layers 121, 122, 123 as described above is used, notably if the layer 122 is a continuous polysilicon or nitride trapping layer. In this embodiment, it is preferable to etch at least the layers 121 and 122 and, where applicable, the layer 123, in the insulation areas of the transistors 110, when forming this insulation, to define localized layers 122 under only some transistors 110. Accordingly, on writing, only some of the transistors 110 may have a controlled threshold voltage, thanks to this insulation.

As shown in FIG. 16, starting from the structure shown in FIG. 2, with a stack of layers 121, 122 and 123, to form the insulation layer 102, the layer 122 is etched to insulate it laterally, which is especially advantageous in the case of a continuous trapping layer.

At the end of each way of producing an electronic subsystem of the present invention, the final steps correspond to the production of the transistors and the contact terminals as explained with reference to the first embodiment.

FIG. 17 thus represents the final structure for the fifth particular embodiment.

There follows a description of the general principle of modifying the transistor threshold voltage.

For an SOI or SON FD transistor, the trapping of charges fixed by the buried insulation induces offsetting of the threshold voltage of the transistor by capacitive coupling. Applying certain biases then enables writing by injecting charges into the insulation layer 102 or 105, to be more precise into the layer 122, where necessary.

Once this writing is done, the charges remain in this layer for a time depending on the retention time of the structure (more than 10 years in the case of stacks used in non-volatile memories). No bias is necessary to maintain the charges. Writing biases may be applied once and for all. It is possible, as an alternative, to delete at any time (which entails reduction or even disappearance of the stored charges) or if necessary to rewrite at any time (to modify the quantity of charges or to refresh the memory).

Figure 18:
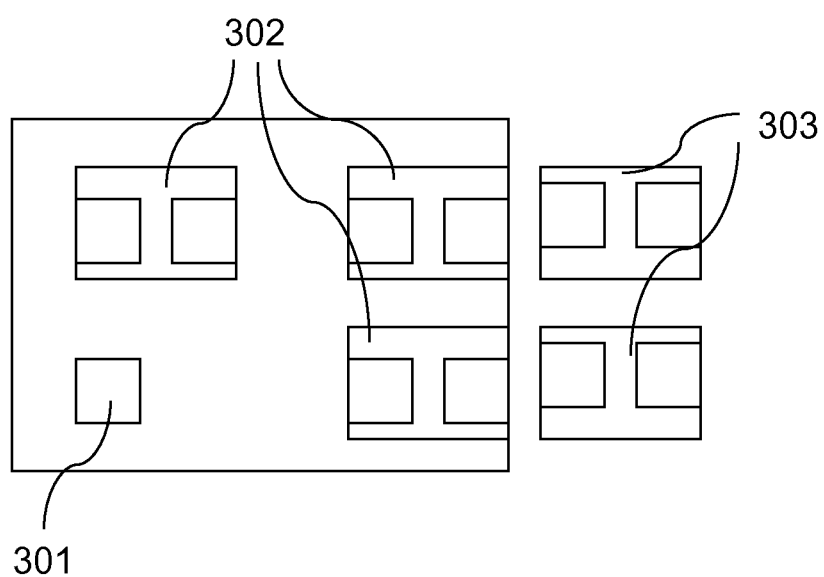
FIG. 18 represents as seen from above a configuration allowing two modes of writing an electronic subsystem of the present invention.

As shown from above in FIG. 18, on the upper surface of the electronic subsystem are located a substrate terminal 301, sets 302 of transistors or logic blocks under the influence of the substrate terminal 301 and sets 303 of transistors or logic blocks that are not under the influence of the substrate terminal 301. This configuration enables an FN writing mode in which all or part of the circuit is controlled by bias of the buried electrode (or by direct bias of the substrate if there is no buried electrode and if the substrate is sufficiently conductive). Thus the Vbs of the transistor is controlled, in particular, the potential difference between the substrate or bulk and the source of the transistor.

In a "hot carrier" second writing mode, only the transistors selected by a high Vds, in particular, a high potential difference between the drain and the source, and a high potential difference between the substrate and the source of the transistor have their threshold voltage adjusted. This writing mode enables transistor by transistor control requiring fewer substrate terminals. If the conductivity of the conductive area is perfect, only one substrate terminal is necessary on the electronic subsystem, or possibly no terminals are necessary if the substrate is sufficiently conductive, the bias being effected by the substrate itself.

Among the advantages of the present invention there may be cited:
- the threshold voltage may be adjusted by bias of the area of the substrate under the transistor concerned (this is known as Fowler Nordheim writing),
- the threshold voltage may be adjusted transistor by transistor by combining a substrate bias and a drain bias (this is known as "hot carrier writing"). In this case, the substrate terminal may be shared/pooled for a plurality of transistors without this assigning them a certain function in relation to the value of the threshold voltage. This adjustment necessitates at least one terminal for controlling the voltage Vds at the terminals of the transistor the threshold voltage of which is to be adjusted or indirect control of the voltage Vds of the transistor via accessible terminals of the circuit in which the transistor is included,
- the threshold voltage may be adjusted by writing more or fewer buried traps, in quasi-continuous manner, whereas only a discrete number of threshold voltage states is permitted if using a plurality of gate output works or a plurality of channel dopings, and
- the threshold voltage of a transistor may be reconfigured by (drain and substrate) bias after fabrication of the transistors. In the prior art, the threshold voltages of the transistors are generally fixed (by the channel doping and the gate output work) during fabrication of the transistors, are not reconfigurable afterwards and may evolve in an uncontrolled manner, notably as a function of temperature or irradiation.

The last two advantages cited above make it possible to envisage the following applications:
- dynamic allocation of consumption/speed of blocks of circuitry parameters,
- compensation of variability of the threshold voltage because of technology fluctuations,
- compensation of the drift of the threshold voltage caused by a change of external temperature (and control of consumption),
- compensation of the drift of the threshold voltage caused by use in an irradiated medium (and increased system service life),
- reconfigurable circuits and
- production of MOS transistors with variable threshold voltage.

It is seen that the useful information of each transistor consists of the transport of charges within the transistor and not the state of charge of the transistor, as in the prior art. Thus the threshold voltage is adapted to optimize the operation of the transistor as a function of the logic or analog application of the transistor.

Because of the coupling of the traps with the gate, the present invention enables a standard transistor application in which it is the transport of charges (in particular, the current) that constitutes the information, the voltage being one parameter among others of the current/voltage characteristic of the device, on the same terms as the mobility of the charge carriers, for example. Similarly, in this application, the state of charge of the structure is not the principal information. Thus in the "transistor" application targeted by the present invention, the information varies according to the function of the transistor. In an analog or radio-frequency (RF) application, the whole of a portion of the current/voltage characteristic of the transistor is used and constitutes the information.

It is seen that it is beneficial to use a buried oxide (or buried oxide stack) that is thin or that has a high dielectric constant to reduce the substrate bias to be applied to charge the traps of this oxide or oxide stack. The inventors have produced stacks enabling deletion/writing at around 10 volts.

The invention claimed is:

1. An electronic subsystem comprising:
   a semiconductor layer;
   at least one first transistor and at least one second transistor each with an adjustable threshold voltage and carried on one side of the semiconductor layer, a channel of the first transistor and the second transistor within the semiconductor layer; and
   on an opposite side of the semiconductor layer, an insulation layer including:
      at a predetermined first depth, a first trapping area extending at least under the channel of the at least one first transistor and including traps with a density greater than a density of traps in a third trapping area outside the first trapping area,
      at a predetermined second depth, a second trapping area extending at least under the channel of the at least one second transistor and including traps with a density greater than a density of traps in a fourth trapping area outside the second trapping area, the second trapping area differing from the first trapping area by at least one of the following features:
         the second depth is different from the first depth, or
         the second trapping area comprises a trap density distribution different from that of the first trapping area, or
         the second trapping area comprises implanted elements different from that of the first trapping area,
   wherein the semiconductor layer and the first and second trapping areas are capacitively coupled, such that the channel of the at least one first transistor and the at least one second transistor is fully depleted of charge carriers, the adjustable threshold voltage of the at least one first and the at least one first second transistors is determined by the density of traps in, respectively, the first and second trapping areas, and an electronic state of the at least one first and second transistors is determined by a transport of electrical charges through the respective channels of the at least one first transistor and the at least one second transistor.

2. The electronic subsystem according to claim 1, wherein: the first trapping area extends only under the channel of the at least one first transistor.

3. The electronic subsystem according to claim 1, wherein the traps comprise nanocrystals.

4. The electronic subsystem according to claim 3, wherein the conductive area comprises an area of a substrate under the insulation layer and includes dopants.

5. The electronic subsystem according to claim 3, wherein the nanocrystals include atoms of Si, Ge, metal or semiconductor/metal alloy in an insulation layer.

6. The electronic subsystem according to claim 1, the traps arise from implanted atoms of N or F coupled with thermal energy.

7. The electronic subsystem according to claim 1 further comprising a conductive area residing, relative to the insulation layer, on the opposite side of the semiconductor layer carrying the at least one first transistor and the at least one second transistor.

8. The electronic subsystem according to claim 7, wherein the conductive area comprises an electrically conductive substrate.

9. A method of producing an electronic subsystem, the method comprising:
   assembling a semiconductor layer carrying, on one side, at least one first transistor and at least one second transistor having an adjustable threshold voltage, a channel of the at least one first transistor and the at least one second transistor within the semiconductor layer and, on an opposite side of the semiconductor layer, an insulation layer;
   forming in the insulation layer, at a predetermined first depth, a first trapping area extending at least under the channel of the at least one first transistor and including traps with a density greater than a density of traps in a third trapping area outside the first trapping area, such that the semiconductor layer and the first trapping area are capacitively coupled and the channel of the at least one first transistor is fully depleted of charge carriers; and
   forming in the insulation layer, at a predetermined second depth, a second trapping area extending at least under the channel of the at least one second transistor and including traps with a density greater than a density of traps in a fourth trapping area outside the second trapping area, such that the semiconductor layer and the second trapping area are capacitively coupled and the channel of the at least one second transistor is fully depleted of charge carriers, the second trapping area differing of the first trapping area by at least one of the following features:
      the second depth is different from the first depth, or
      the second trapping area comprises a trap density distribution different from that of the first trapping area, or
      the second trapping area comprises implanted elements different from that of the first trapping area,
   wherein the adjustable threshold voltage of the at least one first transistor and at least one second transistor is determined by the density of traps in, respectively, the first and second trapping areas, the density of traps depending upon the application of the at least one first transistor and the at least one second transistor as a logic or analog component, and an electronic state of the at least one first transistor and the at least one second transistor is determined by a transport of electrical charges through the respective channel of the at least one first transistor and the at least one second transistor.

10. The method according to claim 9 comprising forming in the insulation layer the first trapping area extending only under the channel of the at least one first transistor.

11. The method according to claim 9 further comprising, during the step of forming the first trapping area, performing a first implantation of atoms of Ge, Si, metal or semiconductor/metal alloy in the insulation layer and during the step of forming the second trapping area extending at least under the channel of the at least one second transistor, performing a second implantation with one or more of an energy or a dose or atoms different from the first implantation.

12. The method according to claim 9 further comprising, during forming the first trapping area, molecularly bonding two insulation layers, wherein the first trapping area is proximate to a bonding interface of the two insulating layers.

13. The method according to claim 9 further comprising, during the step of forming the first trapping area, performing a first implantation of atoms of Ge, Si, metal or a semiconductor-metal alloy in the insulation layer.

14. The method according to claim 13 further comprising, during forming the first trapping area, annealing to form nanocrystals.

15. The method according to claim 9 further comprising, during forming the first trapping area, forming a mask to define the first trapping area.

16. The method according to claim 9 further comprising forming the first trapping area using a transistor gate of the at least one first transistor as a mask to align traps with the channel of the transistor.

17. The method according to claim 9 further comprising, during forming the first trapping area, a gate last alignment of the at least one first transistor is carried out by removing a gate material of the at least one first transistor to form a cavity, implanting species in the cavity and filling the cavity with a new gate material.

18. The method according to claim 9 further comprising FN writing the at least one first transistor of the electronic subsystem.

19. The method according to claim 9 further comprising hot carrier writing the at least one first transistor of the electronic subsystem.

20. The method according to claim 9 further comprising forming a conductive layer and bonding stacks of layers to associate the semiconductor layer, the insulation layer, and the conductive layer.

* * * * *